(12) United States Patent
Jung et al.

(10) Patent No.: US 12,334,135 B2
(45) Date of Patent: Jun. 17, 2025

(54) MEMORY DEVICE AND MEMORY SYSTEM FOR PERFORMING TARGET REFRESH OPERATION, AND OPERATION METHOD THEREOF

(71) Applicant: SK hynix Inc., Gyeonggi-do (KR)

(72) Inventors: Chul Moon Jung, Gyeonggi-do (KR); Byeong Yong Go, Gyeonggi-do (KR); Woongrae Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 193 days.

(21) Appl. No.: 18/322,610

(22) Filed: May 24, 2023

(65) Prior Publication Data

US 2024/0203477 A1 Jun. 20, 2024

(30) Foreign Application Priority Data

Dec. 19, 2022 (KR) .......................... 10-2022-0178284

(51) Int. Cl.
*G11C 11/406* (2006.01)
(52) U.S. Cl.
CPC .............................. *G11C 11/40626* (2013.01)
(58) Field of Classification Search
CPC ............................................... G11C 11/40626
USPC ...................................................... 365/222
See application file for complete search history.

(56) References Cited

U.S. PATENT DOCUMENTS

| 10,861,530 B2 | 12/2020 | Yamada et al. |
| 2018/0082736 A1* | 3/2018 | Jung ................. G11C 11/40626 |
| 2021/0065759 A1 | 3/2021 | Yang et al. |
| 2021/0358539 A1 | 11/2021 | Cowles et al. |
| 2022/0005523 A1 | 1/2022 | Rehmeyer et al. |
| 2022/0270672 A1* | 8/2022 | Kim .................. G11C 11/40603 |

FOREIGN PATENT DOCUMENTS

| KR | 10-2019-0048132 A | 5/2019 |
| KR | 10-2022-0082702 A | 6/2022 |
| KR | 10-2022-0082730 A | 6/2022 |

OTHER PUBLICATIONS

Yeonhong Park et al., Graphene: Strong yet Lightweight Row Hammer Protection, 2020 53rd Annual IEEE/ACM International Symposium on Microarchitecture (MICRO), 2020, pp. 1-13.

* cited by examiner

*Primary Examiner* — Anthan Tran
(74) *Attorney, Agent, or Firm* — IP & T GROUP LLP

(57) ABSTRACT

A memory device includes: a rate control circuit configured to: generate a refresh counting value based on a refresh management command and an internal target refresh command, and generate a rate control signal by comparing the refresh counting value with a target value corresponding to temperature information; and a target command issuing circuit configured to: set a target number according to the rate control signal, and issue the internal target refresh command whenever a number of inputs of a normal refresh command reaches the target number.

19 Claims, 5 Drawing Sheets

FIG. 2

| RFM parameters | | | Memory Device State | | Next Command |
|---|---|---|---|---|---|
| RAAIMT | RAAMULT | RAADEC | tREFI | RAA | |
| 160 | 4x | 2x | 3.9 us (HOT) | 120 | REF |
| | | | | 0 | ACT repeatedly |
| | | | | 1 | |
| | | | | 2 | |
| | | | ⋮ | | |
| | | | 15.6 us (COLD) | 200 | RFM |
| | | | | 0 | - |

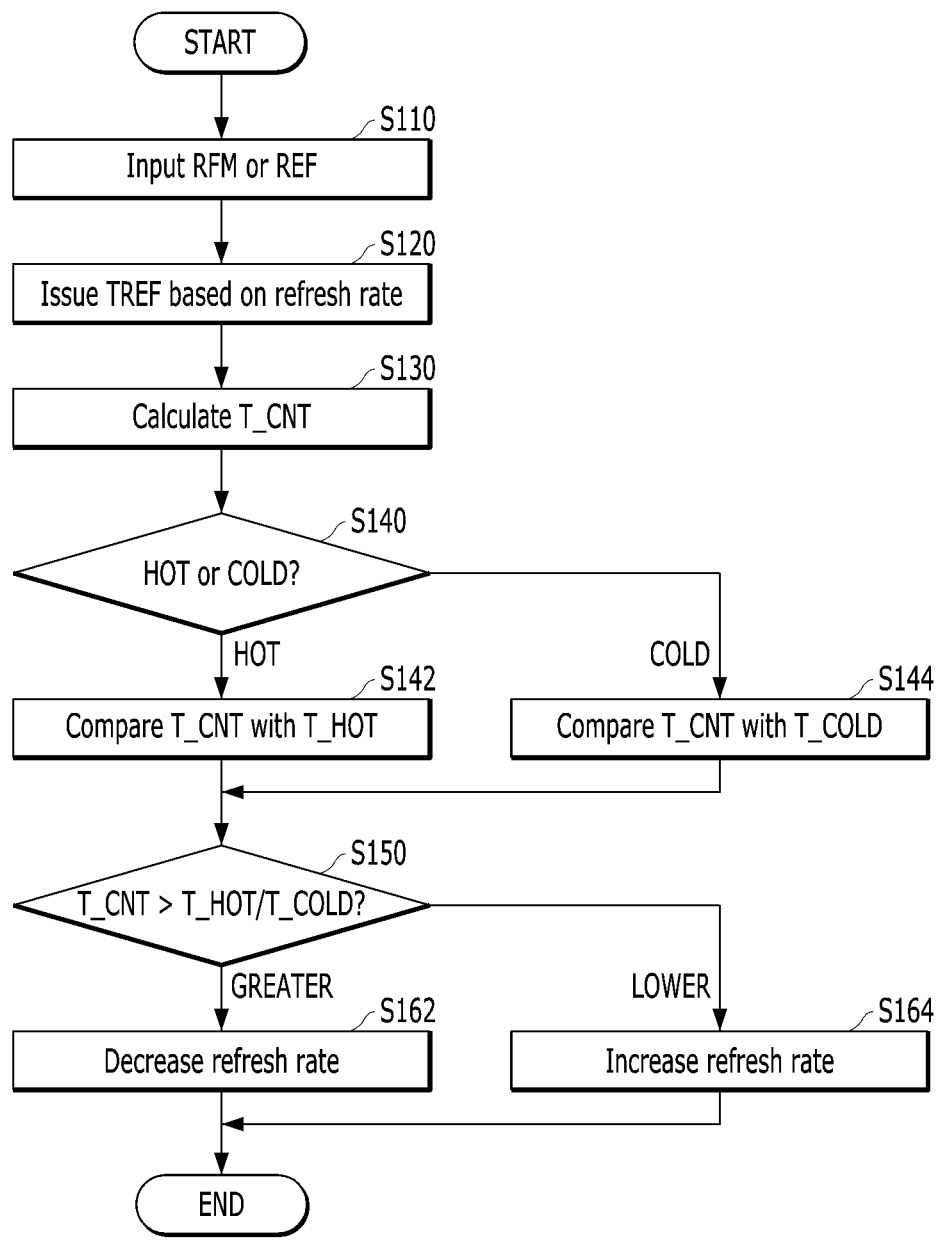

MEMORY DEVICE AND MEMORY SYSTEM FOR PERFORMING TARGET REFRESH OPERATION, AND OPERATION METHOD THEREOF

CROSS-REFERENCE TO RELATED APPLICATIONS

The present application claims priority under 35 U.S.C. § 119(a) to Korean Patent Application No. 10-2022-0178284, filed on Dec. 19, 2022, which is incorporated herein by reference in its entirety.

BACKGROUND

1. Field

Various embodiments of the present invention relate to a semiconductor design technology, and more particularly, to a memory system including a semiconductor memory device that performs a target refresh operation for row-hammer mitigation.

2. Description of the Related Art

Recently, in addition to a normal refresh operation, an additional refresh operation which will be, hereinafter, referred to as a 'target refresh operation', is being performed on the memory cells of a specific word line that is likely to lose data due to a row-hammer phenomenon. The row-hammer phenomenon refers to a phenomenon in which data of memory cells coupled to a specific word line or the word lines disposed adjacent to the word line are damaged due to a high number of activations of the corresponding word line. In order to prevent the row-hammer phenomenon, a target refresh operation is performed on a word line that is activated more than a predetermined number of times and word lines disposed adjacent to the word line.

Recently, a memory controller has provided a refresh command (hereinafter, referred to as a refresh management command) to a memory device to instruct a target refresh operation, in addition to a normal refresh command that instructs to perform a normal refresh operation. Accordingly, a method of efficiently performing a target refresh operation by a memory device has been studied.

SUMMARY

Embodiments of the present invention are directed to a memory device capable of adjusting a refresh rate for temperature according to a total number of issuances of a refresh management command provided by a memory controller and a target refresh command internally generated, and an operation method thereof.

According to an embodiment of the present invention, a memory device includes a rate control circuit configured to: generate a refresh counting value based on a refresh management command and an internal target refresh command, and generate a rate control signal by comparing the refresh counting value with a target value corresponding to temperature information; and a target command issuing circuit configured to: set a target number according to the rate control signal, and issue the internal target refresh command whenever a number of inputs of a normal refresh command reaches the target number.

According to an embodiment of the present invention, a memory system includes a memory controller configured to periodically apply a normal refresh command at the refresh interval, and non-periodically apply a refresh management command; and a memory device configured to: generate an internal target refresh command whenever a number of inputs of the normal refresh command reaches a target number, and adjust the target number by comparing a refresh counting value generated based on a number of inputs of the refresh management command and a number of issuances of the internal target refresh command, with a target value corresponding to temperature information.

According to an embodiment of the present invention, an operation method of a memory device includes receiving a normal refresh command or a refresh management command from a memory controller; generating an internal target refresh command whenever a number of inputs of the normal refresh command reaches a target number; calculating a refresh counting value by summing a number of inputs of the refresh management command and a number of issuances of the internal target refresh command; generating a rate control signal by comparing the refresh counting value with a target value corresponding to temperature information; and adjusting the target number according to the rate control signal.

According to an embodiment of the present invention, an operation method of a memory device includes performing first and second refresh operations, which are independent from each other; performing a third refresh operation when the first refresh operation is performed a reference number of times; and adjusting the reference number based on comparison between a sum and a threshold, wherein the sum is a number of times that the respective second and third refresh operations are performed, and wherein the threshold depends on a temperature of the memory device. The reference number may become less as the temperature becomes higher and may become greater as the temperature becomes lower. The adjusting may include: decreasing the reference number when the sum is less than the threshold; and increasing the reference number when the sum is greater than the threshold. The first refresh operation may be performed in response to an external command provided on a periodic basis, the second refresh operation may be performed in response to an external command provided on a non-periodic basis, and the third refresh operation may be performed autonomously without an external command.

According to embodiments of the present invention, the memory device may increase the number of issuances of the target refresh command at a higher temperature in which the number of issuances of the refresh management command is relatively low, and decrease the number of issuances of the target refresh command at a lower temperature in which the number of issuances of the refresh management command is relatively high, thereby improving the refresh efficiency while increasing the defense ability against the row-hammer attack.

BRIEF DESCRIPTION OF THE DRAWINGS

FIG. 2 is a table showing a condition of issuing a refresh management command in accordance with an embodiment of the present invention.

FIG. 5 is a flow chart for describing an operation of a memory device in accordance with an embodiment of the present invention.

DETAILED DESCRIPTION

Figure 1:
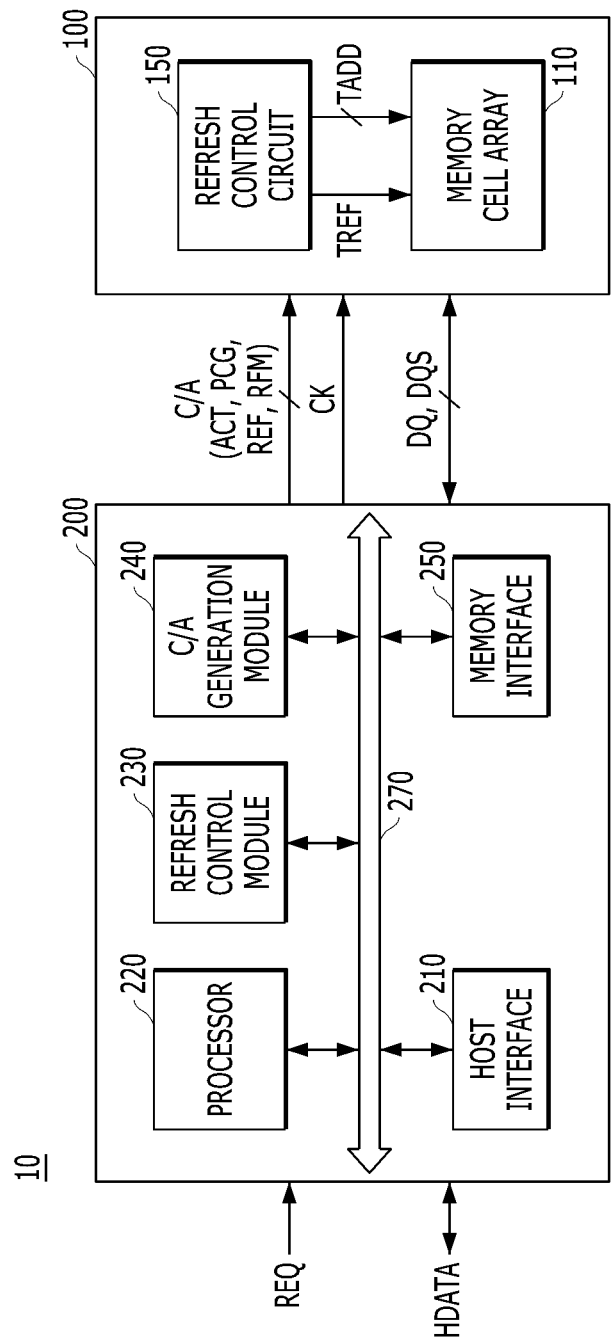
FIG. 1 is a block diagram illustrating a memory system in accordance with an embodiment of the present invention.

Various embodiments of the present disclosure will be described below in more detail with reference to the accompanying drawings. The present disclosure may have embodiments in different forms and should not be construed as limited to the embodiments set forth herein. Rather, these embodiments are provided so that this disclosure will be thorough and complete, and will fully convey the scope of the present invention to those skilled in the art. Throughout this disclosure, like reference numerals refer to like parts throughout the various figures and embodiments of the present disclosure.

It will be understood that when an element is referred to as being "coupled" or "connected" to another element, it may mean that the two are directly coupled or the two are electrically connected to each other with another circuit intervening therebetween. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof. In the present disclosure, the singular forms are intended to include the plural forms as well, unless the context clearly indicates otherwise.

FIG. 1 is a block diagram illustrating a memory system 10 in accordance with an embodiment of the present disclosure.

Referring to FIG. 1, the memory system 10 may include a memory device 100 and a memory controller 200.

The memory controller 200 may control a general operation of the memory system 10 and it may control general data exchange between a host and the memory device 100. The memory controller 200 may generate a command/address signal C/A according to a request REQ from the host and provide the generated command/address signal C/A to the memory device 100. The memory controller 200 may provide a clock CK together with the command/address signal C/A to the memory device 100. The memory controller 200 may provide data DQ corresponding to host data HDATA provided from the host to the memory device 100 together with a data strobe signal DQS. The memory controller 200 may receive the data DQ read from the memory device 100 together with the data strobe signal DQS and provide the data DQ and the data strobe signal DQS to the host as the host data HDATA.

The host may include a Central Processing Unit (CPU), Graphic Processing Unit (GPU), Application Processor (AP), etc. The memory controller 200 may be included in the CPU, GPU, AP, etc. In this case, the host may refer to the components other than the memory controller 200 in these configurations. For example, if the memory controller 200 is included in the CPU, the host may represent the other components excluding the memory controller 200 in the CPU.

In detail, the memory controller 200 may include a host interface 210, a processor 220, a refresh control module 230, a command/address (C/A) generation module 240, a memory interface 250, and a bus 270.

The host interface 210 may be configured to communicate with the host connected to the memory system 10 under the control of the processor 220. For example, the host interface 210 may receive the request REQ and the host data HDATA from the host and provide the host data HDATA to the host by receiving the data DQ read from the memory device 100 through the memory interface 250.

The processor 220 may perform various types of computational and/or other operations for controlling the memory device 100, and/or may execute instructions in the form of firmware or other types of software. The processor 220 may receive the request REQ and the host data HDATA provided from the host through the host interface 210. The processor 220 may generate various commands corresponding to the request REQ, such as an active command ACT, a precharge command PCG, a read command, a write command, a mode register command and the like, and an address. The processor 220 may transmit the host data HDATA to the memory interface 250. The processor 220 may change the order in which the request REQ is received from the host and the order of the operation to be instructed to the memory device 100 to improve the performance of the memory device 100. For example, the processor 220 may adjust the order so that a write operation is performed before a read operation, even if the host requests the read operation of the memory device 100 first and the write operation later. The processor 220 may control overall operations of the host interface 210, the refresh control module 230, the C/A generation module 240, and the memory interface 250.

The refresh control module 230 may generate commands related to a refresh operation, such as a normal refresh command REF as a periodic refresh command signal and a refresh management command RFM as a non-periodic refresh command signal. The refresh control module 230 may periodically generate a normal refresh command REF at regular intervals. The refresh control module 230 may generate a refresh management command RFM when determining that a row-hammer situation has occurred in the memory device 100. For example, the refresh control module 230 may generate the refresh management command RFM non-periodically based on the active command ACT and the normal refresh command REF. A method of issuing the refresh management command RFM will be described in FIG. 2.

The C/A generation module 240 may generate the command/address signal C/A by scheduling the commands and address provided from the processor 220 and the refresh control module 230. The C/A generation module 240 may provide the address to be activated, together with the active command ACT or the precharge command PCG, as the command/address signal C/A, and provide the normal refresh command REF or the refresh management command REFM, as the command/address signal C/A. When the normal refresh command REF is provided from the refresh control module 230, the C/A generation module 240 may hold off from generating the pre-generated active command ACT, the precharge command PCG, the read command and the write command as the command/address signal C/A. In addition, when the refresh operation of the memory device 100 is completed according to the normal refresh command REF, the C/A generation module 240 may generate the suspended active command ACT, the precharge command PCG, the read command and the write command, as a command/address signal C/A.

The memory interface 250 may be configured to communicate with the memory device 100 under the control of the processor 220. For example, the memory interface 250 may transmit the command/address signal C/A and the data DQ to the memory device 100 and transmit the data DQ read from the memory device 100 to the host interface 210.

The processor 220 may transmit data between the host interface 210, the refresh control module 230, the C/A generation module 240, and the memory interface 250 via the bus 270. According to an embodiment, the host interface 210, the refresh control module 230, the C/A generation module 240, and the memory interface 250 may communicate with each other independently without passing through the bus 270. For example, the refresh control module 230 and host interface 210 may communicate directly with each other without passing through the bus 270. The refresh control module 230 and the memory interface 250 may communicate with each other directly without passing through the bus 270. The host interface 210 and the memory interface 250 may also communicate directly with each other without passing through the bus 270.

The memory device 100 may perform an active operation, a precharge operation, a refresh operation, a write operation, and a read operation according to the clock CK, the command/address signal C/A, the data strobe signal DQS, and/or the data DQ that are provided from the memory controller 200. The memory device 100 may be a memory that requires a refresh operation. For example, the memory device 100 may be DRAM, or it may be another type of memory that requires the refresh operation. The refresh operation may include a normal refresh operation in which the memory device 100 sequentially refreshes a plurality of word lines, and a target refresh operation in which one or more neighboring rows disposed adjacent to a row having a large number (or high frequency) of activations are refreshed. The memory device 100 may generate an active command ACT, a precharge command PCG, a normal refresh command REF, and a refresh management command RFM related to a row control operation based on the command/address signal C/A. The memory device 100 may also generate a read command or a write command related to a data input/output operation based on the command/address signal C/A.

In detail, the memory device 100 may include a memory cell array 110 and a refresh control circuit 150.

The memory cell array 110 may include a plurality of memory cells coupled to a plurality of word lines (hereinafter, referred to as a plurality of rows) and a plurality of bit lines (hereinafter, referred to as a plurality of columns), and may be arranged in the form of an array.

The refresh control circuit 150 may provide a target address TADD to select a row to be refreshed during the target refresh operation, among the plurality of rows. The refresh control circuit 150 may issue a target refresh command TREF every time the number of inputs of the normal refresh command REF reaches a target number. The refresh management command RFM is a command provided from the memory controller 200 for the target refresh operation, and the target refresh command TREF may be a command internally generated by the memory device 100 for the target refresh operation. The memory device 100 may perform the normal refresh operation according to the normal refresh command REF and may perform the target refresh operation on at least one row corresponding to the target address TADD according to the refresh management command RFM or the internal target refresh command TREF.

The refresh control circuit 150 may generate a refresh counting value corresponding to the total number of the target refresh operations based on the number of inputs of the refresh management command RFM and the number of issuances of the internal target refresh command TREF. The refresh control circuit 150 may adjust the target number by comparing the refresh counting value with a target value that is determined based on temperature information with the target count and control the frequency of the internal target refresh command TREF according to the target number. Thus, the refresh rate may be controlled. A detailed configuration of the refresh control circuit 150 will be described in FIGS. 3 to 5.

FIG. 2 is a table showing a condition of issuing the refresh management command RFM in accordance with an embodiment of the present invention.

Referring to FIG. 2, the refresh control module 230 of the memory controller 200 may apply the normal refresh command REF as a periodic refresh command signal to the memory device 100 at a regular interval defined in a specification, i.e., a refresh interval tREFI. At this time, the refresh interval tREFI may be set to different values depending on a temperature. For example, if the refresh interval tREFI is set to 7.8 us under a room temperature condition, the refresh interval tREFI in a high temperature HOT higher than a room temperature may be set to 3.9 us, and the refresh interval tREFI in a low temperature COLD lower than the room temperature may be set to 15.6 us.

The refresh control module 230 may determine the issuance of the refresh management command RFM as a non-periodic refresh command signal by managing a value of a rolling accumulative activation (RAA) counter according to a plurality of parameters. The parameters for determining the issuance of the refresh management command RFM include an RAA initial management threshold (RAAIMT), an RAA multiplier (RAAMULT), and an RAA decrement (RAADEC). The value of the RAA counter may be increased by "+1" each time the active command ACT is issued, decreased by the RAA initial management threshold (RAAIMT) each time the normal refresh command REF is issued, and decreased by the RAA initial management threshold (RAAIMT)×RAA decrement (RAADEC) each time the refresh management command RFM is issued.

The refresh control module 230 may determine whether to issue the refresh management command RFM when the value of the RAA counter exceeds the RAA initial management threshold (RAAIMT), while delaying the issuance of the refresh management command RFM until the value of the RAA counter reaches the RAA initial management threshold (RAAIMT)×RAA multiple (RAAMULT). The refresh control module 230 may issue the refresh management command RFM between the RAA initial management threshold (RAAIMT) and the RAA initial management threshold (RAAIMT)×RAA multiple (RAAMULT).

For example, the RAA initial management threshold (RAAIMT) is set to "160", the RAA multiplier (RAAMULT) is set to "4×", and the RAA decrement rate (RAADEC) is set to "2×" as shown in FIG. 2. When the normal refresh command REF is issued in a state that the value of the RAA counter is "120" at the high temperature HOT where the refresh interval tREFI is 3.9 us, the value of the RAA counter may be decreased by 160. As a result, the value of the RAA counter becomes 0. After that, the value of the RAA counter may be increased by "+1" each time the active command ACT is issued. When the refresh management command RFM is issued in a state that the value of the RAA counter is "200" at the low temperature COLD where the refresh interval tREFI is 15.6 us, the value of the RAA counter may be decreased by 160×2=320. As a result, the value of the RAA counter becomes 0.

The refresh management command RFM in the high temperature condition may be issued less than in the low temperature condition because the refresh interval tREFI is short. However, since the row-hammer characteristics vary little by the temperature, the defense ability against the row-hammer attack may be reduced in the high temperature condition.

Hereinafter, in an embodiment of the present invention, a method of increasing the frequency of the internal target refresh command TREF when the refresh management command RFM from the memory controller 200 is less inputted at the high temperature condition, while decreasing the frequency of the internal target refresh command TREF when the refresh management command RFM is more inputted at the low temperature condition, will be described. Hereinafter, to focus on a refresh operation, a description of a configuration associated with a data input/output operation will be omitted.

Figure 3:
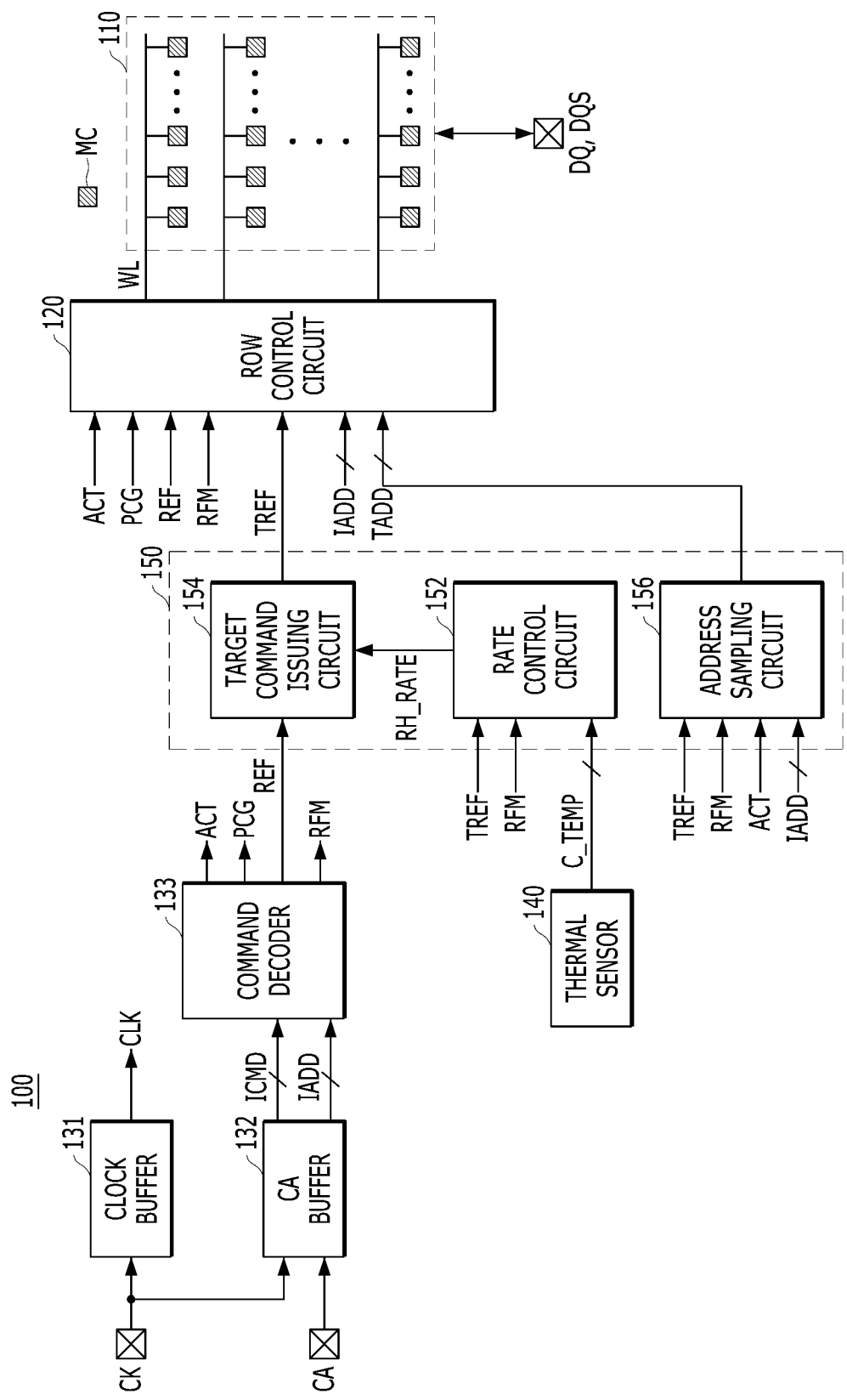
FIG. 3 is a detailed block diagram illustrating a memory device in accordance with an embodiment of the present invention.

FIG. 3 is a detailed block diagram illustrating a memory device 100 in accordance with an embodiment of the present invention.

Referring to FIG. 3, the memory device 100 may include the memory cell array 110, a row control circuit 120, a clock buffer 131, a command/address (CA) buffer 132, a command decoder 133, a thermal sensor 140, and a refresh control circuit 150.

The memory cell array 110 may include a plurality of memory cells MC coupled to rows WL and columns may be arranged in the form of an array. The memory cell array 110 may be composed of at least one bank. The number of banks or the number of memory cells MC may be determined depending on the capacity of the memory device 100.

The clock buffer 131 may receive a clock CK from the memory controller (200 of FIG. 1). The clock buffer 131 may generate an internal clock CLK by buffering the clock CK. Depending on an embodiment, the memory controller 200 may transfer system clocks to the memory device 100 in a differential manner, and the memory device 100 may include clock buffers that receive the differential clocks, respectively.

The CA buffer 132 may receive a command/address signal C/A from the memory controller 200 based on the clock CK. The CA buffer 132 may sample the command/address signal C/A based on the clock CK and output an internal command ICMD and an internal address IADD. Consequently, the memory device 100 may be synchronized with the clock CK.

The command decoder 133 may decode the internal command ICMD which is output from the CA buffer 132 to generate an active command ACT, a precharge command PCG, a normal refresh command REF, and a refresh management command RFM. Although not illustrated, the command decoder 133 may additionally generate a read command, a write command, a mode register command, and the like by decoding the internal command ICMD.

The thermal sensor 140 may measure an internal temperature of the memory device 100 and output the measured internal temperature as temperature information C_TEMP. The thermal sensor 140 may update the temperature information C_TEMP every predetermined time. According to an embodiment, the thermal sensor 140 may be embedded inside or disposed outside the memory device 100.

The refresh control circuit 150 may issue the internal target refresh command TREF whenever the number of inputs of the normal refresh command REF reaches a target number. In particular, the refresh control circuit 150 may adjust the target number according to the refresh management command RFM, the internal target refresh command TREF, and the temperature information C_TEMP. The refresh control circuit 150 may sample the internal address IADD as a plurality of sampling addresses according to the active command ACT, and output one of the sampling addresses as a target address TADD according to the refresh management command RFM or the internal target refresh command TREF.

More specifically, the refresh control circuit 150 may include a rate control circuit 152, a target command issuing circuit 154, and an address sampling circuit 156.

The rate control circuit 152 may generate a refresh counting value (T_CNT in FIG. 4) based on the number of inputs of the refresh management command RFM and the number of issuances of the internal target refresh command TREF. The refresh counting value T_CNT may have a value corresponding to the total number of target refresh operations. The rate control circuit 152 may generate a rate control signal RH_RATE by comparing the refresh counting value T_CNT with a target value corresponding to the temperature information C_TEMP.

The target command issuing circuit 154 may issue the internal target refresh command TREF based on the rate control signal RH_RATE and the normal refresh command REF. The target command issuing circuit 154 may set the target number according to the rate control signal RH_RATE, and issue at least one internal target refresh command TREF whenever the number of inputs of the normal refresh command REF reaches the target number.

The address sampling circuit 156 may store the internal address IADD input with the active command ACT as the sampling addresses, and output one of the sampling addresses as the target address TADD according to the refresh management command RFM or the internal target refresh command TREF. For example, the address sampling circuit 156 may be implemented with a pipe latch circuit that sequentially stores the internal address IADD according to the active command ACT and sequentially outputs the stored addresses according to the refresh management command RFM or the internal target refresh command TREF.

Depending on an embodiment, the refresh control circuit 150 may further include an adjacent address calculation circuit for calculating row hammer addresses that specify rows adjacent to a target row corresponding the target address TADD output from the address sampling circuit 156, and providing the row hammer addresses to the memory cell array 110.

The row control circuit 120 may activate a row WL corresponding to the internal address IADD according to the active command ACT, and precharge the activated row WL according to the precharge command PCG. In order to select a row to be refreshed during the normal refresh operation, a refresh counter (not shown) for generating a counting address that is sequentially increasing according to the normal refresh command REF may be additionally provided. The row control circuit 120 may perform the normal refresh operation of sequentially refreshing the plurality of rows WL corresponding to the counting address according to the normal refresh command REF. The row control circuit 120 may perform the target refresh operation of refreshing one or more rows corresponding to the target address TADD according to the refresh management command RFM or the internal target refresh command TREF.

Though it is not shown, the memory device 100 may further include a column control circuit for selecting columns corresponding to a column address among the internal address IADD, according to the read command or the write command. The memory device 100 may output data DQ read from the memory cell array 110 through the selected columns, together with a data strobe signal DQS to the memory interface 250 of the memory controller 200.

Figure 4:
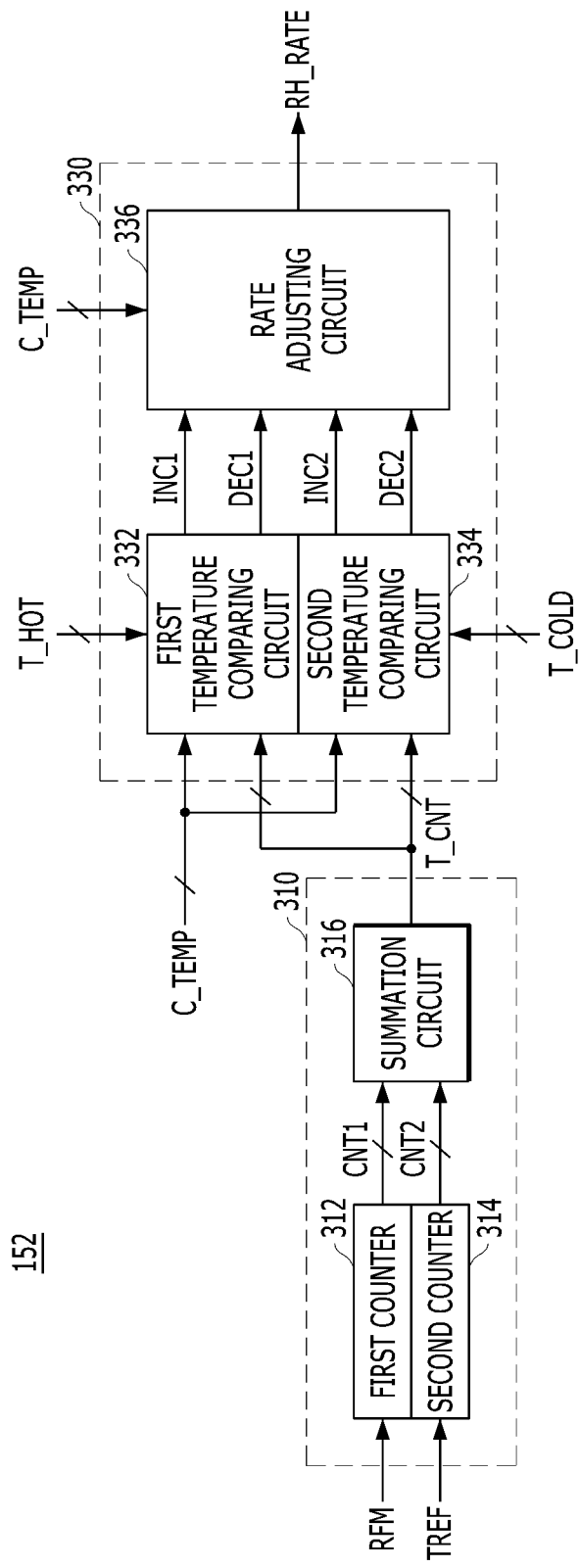
FIG. 4 is a detailed configuration diagram illustrating a rate control circuit of FIG. 3 in accordance with an embodiment of the present invention.

FIG. 4 is a detailed configuration diagram illustrating the rate control circuit 152 of FIG. 3 in accordance with an embodiment of the present invention.

Referring to FIG. 4, the rate control circuit 152 may include a counting circuit 310 and a determination circuit 330.

The counting circuit 310 may generate the refresh counting value T_CNT by summing the number of inputs of the refresh management command RFM and the number of issuances of the internal target refresh command TREF. In more detail, the counting circuit 310 may include a first counter 312, a second counter 314, and a summation circuit 316. The first counter 312 may generate a first counting value CNT1 by counting the number of inputs of the refresh management command RFM. The second counter 314 may generate a second counting value CNT2 by counting the number of issuances of the internal target refresh command TREF. The summation circuit 316 may generate the refresh counting value T_CNT by summing the first counting value CNT1 and the second counting value CNT2. The summation circuit 316 may be implemented with a known adder. Depending on an embodiment, the first counter 312 and the second counter 314 may be initialized whenever the number of issuances of the internal target refresh command TREF reaches a specific number of times. For example, if the internal target refresh command TREF is issued 100 times and the first counting value CNT1 reaches 100, the first counter 312 and the second counter 314 may be initialized to set the first counting value CNT1 and the second counting value CNT2 to "0".

The determination circuit 330 may determine whether the memory device 100 is in a high or low temperature state based on the temperature information C_TEMP, and generate the rate control signal RH_RATE by comparing the refresh counting value T_CNT with the target value corresponding to the temperature state. For example, the determination circuit 330 may set a first target value T_HOT corresponding to a high temperature state and a second target value T_COLD corresponding to a low temperature state, respectively, and select one of the first target value T_HOT and the second target value T_COLD according to the temperature information C_TEMP. The determination circuit 330 may generate the rate control signal RH_RATE by comparing the selected target value with the refresh counting value T_CNT. According to an embodiment, the first target value T_HOT and the second target value T_COLD may be provided externally.

In detail, the determination circuit 330 may include a first temperature comparing circuit 332, a second temperature comparing circuit 334, and a rate adjusting circuit 336.

The first temperature comparing circuit 332 may set the first target value T_HOT corresponding to a high temperature state. As shown in FIG. 4, the first temperature comparing circuit 332 may receive and store the first target value T_HOT from the outside. The first temperature comparing circuit 332 may become operative when the temperature information C_TEMP indicating a high temperature state is inputted and may generate a first increase signal INC1 or a first decrease signal DEC1 by comparing the first target value T_HOT with the refresh counting value T_CNT. For example, the first temperature comparing circuit 332 may generate the first decrease signal DEC1 when the refresh counting value T_CNT is greater than the first target value T_HOT and generate the first increase signal INC1 when the refresh counting value T_CNT is less than the first target value T_HOT.

The second temperature comparing circuit 334 may set the second target value T_COLD corresponding to a low temperature state. As shown in FIG. 4, the second temperature comparing circuit 334 may receive and store the second target value T_COLD from the outside. The second temperature comparing circuit 334 may become operative when the temperature information C_TEMP indicating a low temperature state is inputted, and may generate a second increase signal INC2 or a second decrease signal DEC2 by comparing the second target value T_COLD with the refresh counting value T_CNT. For example, the second temperature comparing circuit 334 may generate the second decrease signal DEC2 when the refresh counting value T_CNT is greater than the second target value T_COLD and generate the second increase signal INC2 when the refresh counting value T_CNT is less than the second target value T_COLD.

The rate adjusting circuit 336 may set the rate control signal RH_RATE according to the temperature information C_TEMP. The rate control signal RH_RATE may be a signal configured as multi-bit. The rate adjusting circuit 336 may adjust the value of the rate control signal RH_RATE according to the first increase signal INC1, the first decrease signal DEC1, the second increase signal INC2, or the second decrease signal DEC2. The rate adjusting circuit 336 may set bits of the rate control signal RH_RATE to have a value corresponding to the temperature information C_TEMP, and may adjust the value of the bits set according to the first increase signal INC1, the first decrease signal DEC1, the second increase signal INC2, or the second decrease signal DEC2.

The rate adjusting circuit 336 may increase the value of the rate control signal RH_RATE so that the internal target refresh command TREF is issued more frequently at the high temperature than the low temperature. For example, the rate adjusting circuit 336 may set the rate control signal RH_RATE to "8" according to the temperature information C_TEMP indicating a room temperature. The rate adjusting circuit 336 may set the rate control signal RH_RATE to "10" according to the temperature information C_TEMP indicating the high temperature state, and adjust (i.e., increase) the rate control signal RH_RATE to "11" according to the first increase signal INC1, or adjust (i.e., decrease) the rate control signal RH_RATE to "9" according to the first decrease signal DEC1. In addition, the rate adjusting circuit 336 may set the rate control signal RH_RATE to "6" according to the temperature information C_TEMP indicating the low temperature state, and adjust (i.e., increase) the rate control signal RH_RATE to "7" according to the second increase signal INC2, or adjust (i.e., decrease) the rate control signal RH_RATE to "5" according to the second decrease signal DEC2.

With the above configuration, the rate control circuit 152 may set the value of the rate control signal RH_RATE according to the temperature information C_TEMP, and maintain the value of the rate control signal RH_RATE when the refresh counting value T_CNT is substantially the same as the target value according to the temperature information C_TEMP. On the other hand, the rate control circuit 152 may adjust the value of the rate control signal RH_RATE to decrease the refresh rate when the refresh count value T_CNT is greater than the set target value, and to increase the refresh rate when the refresh count value T_CNT is less than the set target value.

Hereinafter, a method of operating the memory device 100 according to an embodiment of the present invention will be described with reference to FIGS. 1 to 5.

FIG. 5 is a flow chart for describing an operation of the memory device 100 in accordance with an embodiment of the present invention.

Referring to FIG. 5, the memory controller 200 may periodically apply the normal refresh command REF at the refresh interval tREFI or may non-periodically apply the refresh management command RFM by managing the value of the RAA counter according to the parameters (at S110). At this time, the refresh interval tREFI is defined to have different values depending on the temperature, and the refresh management command RFM may be provided to the memory device 100 a smaller number of times at a higher temperature state than a low temperature state.

The memory device 100 may perform a normal refresh operation that sequentially refreshes a plurality of rows according to the normal refresh command REF. The target command issuing circuit 154 may set the target number according to the rate control signal RH_RATE and generate the internal target refresh command TREF whenever the number of inputs of the normal refresh command REF reaches the target number (at S120).

The sampling circuit 156 may store the internal address IADD input with the active command ACT as the sampling addresses and output one of the sampling addresses as the target address TADD according to the refresh management command RFM or the internal target refresh command TREF. Accordingly, the row control circuit 120 may perform a target refresh operation on at least one row corresponding to the target address TADD according to the internal target refresh command TREF or the refresh management command RFM.

Hereinafter, it is shown that the rate control signal RH_RATE is set to a default value of "8" and the target number is set to "70" when the temperature information C_TEMP indicates the room temperature. The rate control signal RH_RATE is set to a default value of "10" and the target number is set to "50" when the temperature information C_TEMP indicates the high temperature state. The rate control signal RH_RATE is set to a default value of "6" and the target number is set to "100" when the temperature information C_TEMP indicates the low temperature state. Accordingly, the target command issuing circuit 154 may issue the internal target refresh command TREF whenever the number of inputs of the normal refresh command REF reaches the target number "70" at the room temperature. The target command issuing circuit 154 may issue the internal target refresh command TREF whenever the number of inputs of the normal refresh command REF reaches the target number "50" at the high temperature state and may issue the internal target refresh command TREF whenever the number of inputs of the normal refresh command REF reaches the target number "100" at the low temperature state. As a result, the target command issuing circuit 154 may issue the internal target refresh command TREF more frequently at the high temperature than the low temperature.

When the refresh management command RFM is input or the internal target refresh command TREF is issued, the counting circuit 310 may calculate the refresh counting value T_CNT by summing the number of inputs of the refresh management command RFM and the number of issuances of the internal target refresh command TREF (at S130). For example, the counting circuit 310 may generate the first counting value CNT1 of "10" by counting the number of inputs of the refresh management command RFM, generate the second counting value CNT2 "5" by counting the number of issuances of the internal target refresh command TREF, and generate the refresh count value T_CNT of "15" by summing the first counting value CNT1 and the second counting value CNT2. That is, it may be seen that the target refresh operation according to the refresh management command RFM or the internal target refresh command TREF has been performed 15 times.

The determination circuit 330 may determine whether the temperature of the memory device 100 is in the high temperature state or the low temperature state based on the temperature information C_TEMP (at S140).

When the temperature is at the high temperature state ("HOT" in S140), the first temperature comparing circuit 332 becomes operative to generate the first increase signal INC1 or the first decrease signal DEC1 by comparing the refresh counting value T_CNT with the first target value T_HOT corresponding to the high temperature state (at S142).

If the refresh counting value T_CNT is greater than the first target value T_HOT ("GREATER" of S150), the first temperature comparing circuit 332 may generate the first decrease signal DEC1 and the rate adjusting circuit 336 may decrease the rate control signal RH_RATE, which has been set to the default value of "10", to "9" according to the first decrease signal DEC1, thereby decreasing the refresh rate (at S162). The target command issuing circuit 154 may adjust or increase the target number to "60" according to the decreased rate control signal RH_RATE and issue the internal target refresh command TREF whenever the number of inputs of the normal refresh command REF reaches the target number "60". As a result, the internal target refresh command TREF may be issued less frequently, thereby improving refresh efficiency.

On the other hand, if the refresh counting value T_CNT is less than the first target value T_HOT ("LOWER" of S150), the first temperature comparing circuit 332 may generate the first increase signal INC1, and the rate adjusting circuit 336 may increase the rate control signal RH_RATE, which has been set to the default value of "10", to "11" according to the first increase signal INC1, thereby increasing the refresh rate (at S164). The target command issuing circuit 154 may adjust or decrease the target number to "40" according to the increased rate control signal RH_RATE and issue the internal target refresh command TREF whenever the number of inputs of the normal refresh command REF reaches the target number "40". As a result, the internal target refresh command TREF may be generated more frequently. That is, even if relatively few refresh management commands RFM are provided at the high temperature state, the defense ability against the row-hammer attack may be improved by generating the internal target refresh commands TREF more frequently.

When the temperature is at the low temperature state ("COLD" in S140), the second temperature comparing circuit 334 becomes operative to generate the second increase signal INC2 or the second decrease signal DEC2 by comparing the refresh counting value T_CNT with the second target value T_COLD corresponding to the low temperature state (at S144).

If the refresh counting value T_CNT is greater than the second target value T_COLD ("GREATER" of S150), the second temperature comparing circuit 334 may generate the second decrease signal DEC2, and the rate adjusting circuit 336 may decrease the rate control signal RH_RATE, which has been set to the default value of "6", to "5" according to the second decrease signal DEC2, thereby decreasing the refresh rate (at S162). The target command issuing circuit 154 may adjust or increase the target number to "110" according to the decreased rate control signal RH_RATE and issue the internal target refresh command TREF whenever the number of inputs of the normal refresh command REF reaches the target number "110". As a result, the internal target refresh command TREF may be issued less frequently, thereby improving refresh efficiency.

On the other hand, if the refresh counting value T_CNT is less than the second target value T_COLD ("LOWER" of S150), the second temperature comparing circuit 334 may generate the second increase signal INC2, and the rate adjusting circuit 336 may increase the rate control signal RH_RATE which has been set to the default value of "6", to "7" according to the second increase signal INC2, thereby increasing the refresh rate (at S164). The target command issuing circuit 154 may adjust or decrease the target number to "90" according to the increased rate control signal RH_RATE and issue the internal target refresh command TREF whenever the number of inputs of the normal refresh command REF reaches the target number "90". As a result, the internal target refresh command TREF may be generated more frequently. That is, even if relatively few refresh management commands RFM are provided at the low temperature state, the defense ability against the row-hammer attack may be improved by generating the internal target refresh commands TREF more frequently.

As described above, the memory device 100 according to the embodiment of the present invention may adjust the refresh rate at each temperature range according to the total number of issuances of the refresh management command RFM provided from the memory controller 200 and the target refresh command TREF generated internally. Accordingly, even if relatively few refresh management commands RFM are provided at the high temperature, the defense ability against the row-hammer attack may be improved by generating the internal target refresh commands TREF more frequently. In addition, when a relatively large number of the refresh management commands RFM are provided from the memory controller 200 at the low temperature state, the refresh efficiency may be improved by generating the internal target refresh command TREF less frequently.

Various embodiments of the present disclosure have been described in the drawings and specification. Although specific terminologies are used here, the terminologies are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein. The embodiments may be combined to form additional embodiments.

It should be noted that although the technical spirit of the disclosure has been described in connection with embodiments thereof, this is merely for description purposes and should not be interpreted as limiting. It should be appreciated by one of ordinary skill in the art that various changes may be made thereto without departing from the technical spirit of the disclosure and the following claims.

For example, for the logic gates and transistors provided as examples in the above-described embodiments, different positions and types may be implemented depending on the polarity of the input signal.

What is claimed is:

1. A memory device, comprising:
a rate control circuit configured to:
generate a refresh counting value based on a refresh management command and an internal target refresh command, and
generate a rate control signal by comparing the refresh counting value with a target value corresponding to temperature information; and
a target command issuing circuit configured to:
set a target number according to the rate control signal, and
issue the internal target refresh command whenever a number of inputs of a normal refresh command reaches the target number.

2. The memory device of claim 1,
wherein the refresh management command is non-periodically applied from a memory controller, and
wherein the refresh management command is applied a smaller number of times at a higher temperature state than a low temperature state.

3. The memory device of claim 1, wherein the rate control circuit incudes:
a counting circuit configured to calculate the refresh counting value by summing a number of inputs of the refresh management command and a number of issuances of the internal target refresh command; and
a determination circuit configured to:
determine a temperature state based on the temperature information, and
generate the rate control signal by comparing the refresh counting value with the target value corresponding to the temperature state.

4. The memory device of claim 3, wherein the counting circuit incudes:
a first counter configured to generate a first counting value by counting the number of inputs of the refresh management command;
a second counter configured to generate a second counting value by counting the number of issuances of the internal target refresh command; and
a summation circuit configured to generate the refresh counting value by summing the first counting value and the second counting value.

5. The memory device of claim 3, wherein the determination circuit incudes:
a first temperature comparing circuit configured to:
set a first target value corresponding to a high temperature state, and
generate, when the temperature information indicates the high temperature state, a first increase signal or a first decrease signal by comparing the first target value with the refresh counting value;
a second temperature comparing circuit configured to:
set a second target value corresponding to a low temperature state, and
generate, when the temperature information indicates the low temperature state, a second increase signal or a second decrease signal by comparing the second target value with the refresh counting value; and
a rate adjusting circuit configured to:
set the rate control signal according to the temperature information, and
adjust a value of the rate control signal according to the first increase signal, the first decrease signal, the second increase signal, or the second decrease signal.

6. The memory device of claim 5,
wherein the first temperature comparing circuit is configured to generate the first decrease signal when the refresh counting value is greater than the first target value and generate the first increase signal when the refresh counting value is less than the first target value, and
wherein the second temperature comparing circuit is configured to generate the second decrease signal when the refresh counting value is greater than second target value and generate the second increase signal when the refresh counting value is less than the second target value.

7. The memory device of claim 1, further comprising an address sampling circuit configured to:
store an address input with an active command as a sampling address, and
output, as a target address, one of a plurality of the sampling addresses according to the refresh management command or the internal target refresh command.

8. The memory device of claim 7, further comprising a row control circuit configured to refresh one or more rows corresponding to the target address according to the refresh management command or the internal target refresh command.

9. A memory system, comprising:
a memory controller configured to periodically apply a normal refresh command at the refresh interval, and non-periodically apply a refresh management command; and
a memory device configured to:
generate an internal target refresh command whenever a number of inputs of the normal refresh command reaches a target number, and
adjust the target number by comparing a refresh counting value generated based on a number of inputs of the refresh management command and a number of issuances of the internal target refresh command, with a target value corresponding to temperature information.

10. The memory system of claim 9, wherein the memory controller is configured to apply the refresh management command a smaller number of times at a higher temperature state than a low temperature state.

11. The memory system of claim 9, wherein the memory device includes:
a counting circuit configured to calculate the refresh counting value by summing the number of inputs of the refresh management command and the number of issuances of the internal target refresh command;
a determination circuit configured to:
determine a temperature state based on the temperature information, and
generate a rate control signal by comparing the refresh counting value with the target value corresponding to the temperature state; and
a target command issuing circuit configured to:
set the target number according to the rate control signal, and
issue the internal target refresh command whenever the number of inputs of the normal refresh command reaches the target number.

12. The memory system of claim 11, wherein the counting circuit incudes:
a first counter configured to generate a first counting value by counting the number of inputs of the refresh management command;
a second counter configured to generate a second counting value by counting the number of issuances of the internal target refresh command; and
a summation circuit configured to generate the refresh counting value by summing the first counting value and the second counting value.

13. The memory system of claim 11, wherein the determination circuit incudes:
a first temperature comparing circuit configured to:
set a first target value corresponding to a high temperature state, and
generate, when the temperature information indicates the high temperature state, a first increase signal or a first decrease signal by comparing the first target value with the refresh counting value;
a second temperature comparing circuit configured to:
set a second target value corresponding to a low temperature state, and
generate, when the temperature information indicates the low temperature state, a second increase signal or a second decrease signal by comparing the second target value with the refresh counting value; and
a rate adjusting circuit configured to:
set the rate control signal according to the temperature information, and
adjust a value of the rate control signal according to the first increase signal, the first decrease signal, the second increase signal, or the second decrease signal.

14. The memory system of claim 9, wherein the memory device includes:
an address sampling circuit configured to:
store an address input with an active command as a sampling address, and
output, as a target address, one of a plurality of sampling addresses according to the refresh management command or the internal target refresh command; and
a row control circuit configured to refresh one or more rows corresponding to the target address according to the refresh management command or the internal target refresh command.

15. An operation method of a memory device, the operation method comprising:
receiving a normal refresh command or a refresh management command from a memory controller;
generating an internal target refresh command whenever a number of inputs of the normal refresh command reaches a target number;
calculating a refresh counting value by summing a number of inputs of the refresh management command and a number of issuances of the internal target refresh command;
generating a rate control signal by comparing the refresh counting value with a target value corresponding to temperature information; and
adjusting the target number according to the rate control signal.

16. The operation method of claim 15,
wherein the refresh management command is non-periodically applied from the memory controller, and
wherein the refresh management command is applied a smaller number of times at a higher temperature state than a low temperature state.

17. The operation method of claim 15, wherein the calculating a refresh counting value includes:
generating a first counting value by counting the number of inputs of the refresh management command;

generating a second counting value by counting the number of issuances of the internal target refresh command; and generating the refresh counting value by summing the first counting value and the second counting value.

18. The operation method of claim 15, wherein the generating a rate control signal includes:

setting a first target value corresponding to a high temperature state and a second target value corresponding to a low temperature state; and setting the rate control signal by comparing the refresh counting value with one of the first target value and the second target value according to the temperature information.

19. The operation method of claim 18, wherein the setting the rate control signal includes:

generating a first increase signal or a first decrease signal by comparing, according to the temperature information indicating the high temperature state, the first target value with the refresh counting value;

generating a second increase signal or a second decrease signal by comparing, according to the temperature information indicating the low temperature state, the second target value with the refresh counting value;

setting the rate control signal according to the temperature information; and adjusting a value of the rate control signal according to the first increase signal, the first decrease signal, the second increase signal, or the second decrease signal.

* * * * *